United States Patent [19]

Chehab et al.

[11] Patent Number: 5,279,680
[45] Date of Patent: Jan. 18, 1994

[54] SOLAR MODULE AND PROCESS FOR ITS MANUFACTURE

[75] Inventors: Oussama Chehab, Neuss; Wolfgang Jager, Witten, both of Fed. Rep. of Germany

[73] Assignee: Flachglas-Solartechnik GmbH, Fed. Rep. of Germany

[21] Appl. No.: 907,115

[22] Filed: Jul. 1, 1992

[30] Foreign Application Priority Data

Jul. 6, 1991 [DE] Fed. Rep. of Germany ....... 4122721

[51] Int. Cl.$^5$ .................... H01L 31/048; H01L 31/18
[52] U.S. Cl. .................................. 136/251; 136/259; 156/250; 437/2
[58] Field of Search ............... 136/251, 259; 156/250; 437/2-5

[56] References Cited

U.S. PATENT DOCUMENTS

| | | | |
|---|---|---|---|
| 4,880,677 | 11/1989 | Hecq et al. | 428/38 |
| 5,011,544 | 4/1991 | Gaddy | 136/246 |
| 5,059,254 | 10/1991 | Yaba et al. | 136/251 |
| 5,176,758 | 11/1993 | Nath et al. | 136/251 |

FOREIGN PATENT DOCUMENTS

2188924 10/1987 United Kingdom ............... 136/256

*Primary Examiner*—Aaron Weisstuch
*Attorney, Agent, or Firm*—Sughrue, Mion, Zinn, Macpeak & Seas

[57] ABSTRACT

A solar module including an outer pane adapted to face solar radiation after its installation, a carrier panel of clear, transparent material, such as silicate glass of at least partially transparent material arranged at a distance from the outer pane and a solar energy conversion device located between the outer pane and the carrier panel, is provided with a decorative glass pane with a number of crack planes running essentially vertical to the module plane. The decorative pane may be disposed between the outer pane and the conversion device or between the carrier panel and the solar conversion device without reducing the electrical output of the solar conversion device.

18 Claims, 1 Drawing Sheet

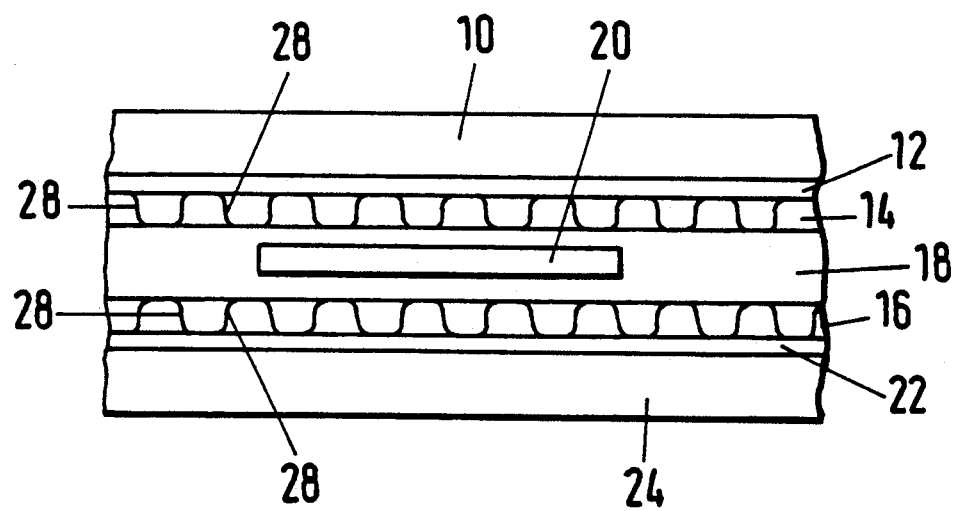

SOLAR MODULE AND PROCESS FOR ITS MANUFACTURE

BACKGROUND OF THE INVENTION

This invention relates to a solar module with an outer pane facing the solar radiation after installation, consisting of clear transparent material, such as silicate glass, a carrier panel located at a distance from the outer pane, consisting of at least partially transparent material, and a solar energy conversion device located between the outer pane and the carrier panel, a process for production of such a solar module, where an outer pane and a carrier panel are combined by interposing a solar energy conversion device, in particular an array of solar cells embedded in a plastic layer, to form a composite module, as well as the use of such a solar module.

In the case of solar modules of the generic type, as described for example in DE-OS 29 42 328 or EP-OS 0 382 060, the problem consists, as previously set forth in German Patent Application P 40 29 822.1, of the fact that on account of the relatively thick or wide connecting leads and conductors for the individually connected solar cells, frequently produced by silk screen printing, the external appearance does not meet the aesthetic and in particular architectural requirements imposed, preferably when used as a curtain wall element. It has already been proposed, e.g. in EP- 0 343 628 and in the above cited Patent Application P 40 29 822.1, to reduce the impairment of the overall aesthetic impression of the solar module due to the conductor structure, but also due to the technical details of the solar cell itself, which are perceptible through the transparent outer pane, by providing a painted color coating at least in some areas or by using a colored or matted interlayer. EP- 0 343 628 teaches in this connection a printed edge coating which is able to conceal the connecting lead arrangement at the edge of the solar module.

The known attempts to improve the aesthetic impression of solar modules of the generic type have all had the disadvantage that this always involves a significant reduction in electrical output, because a printed coating on partial areas as well as matting or opalizing of the outer pane facing the incidence of light reduces the light transmission. A reduction in electrical output is of course wholly undesirable in the case of solar modules.

SUMMARY OF THE INVENTION

The purpose of the invention is to specify a solar module of the generic type as well as a process for its manufacture and use where the desired effect of improvement of the aesthetic impression can be achieved without significant reduction of yield.

This problem is solved by the invention in the case of a solar module of the generic type by providing a glass pane with a number of crack planes running essentially vertical to the module plane on the outside and/or inside of the solar energy conversion device.

The foregoing and other objects, features and advantages of the invention will be apparent from the following more particular description of a preferred embodiment of the invention as illustrated in the accompanying drawings.

BRIEF DESCRIPTION OF THE DRAWING

The single drawing is a schematic side elevational view of a solar module incorporating the present invention.

DETAILED DESCRIPTION OF THE INVENTION

The solar module shown schematically in the drawings is comprised of an outer pane of glass 10, a first intermediate pane of glass 14, a second intermediate decorative pane of glass 16 and a bottom pane of glass 24 constituting a carrier panel. A solar energy conversion device 20 is embedded in a plastic layer 18 which may be comprised of a laminated film combination, a cast resin layer or the like.

The first intermediate pane 14 may be bonded to the outer pane 10 by means of a laminated film or cast resin layer 12. Likewise, the second intermediate or ornamental pane 16 may be bonded to the bottom pane or carrier panel 24 by means of a laminated film or cast resin layer 22.

As shown schematically in the drawing, the intermediate pane 14 and the ornamental pane 16 have a number of crack planes 28 running essentially vertical to the module plane. According to other embodiments described hereinafter any one or more panes or combinations of panes may be provided with crack planes. Provision can be made for the outer pane to incorporate a number of crack planes running essentially vertical to the module plane.

Furthermore, the invention provides for the carrier panel to incorporate a number of crack planes running essentially vertical to the module plane.

A further embodiment of the invention is characterized by the fact that between the solar energy conversion device and the outer pane, an intermediate pane is arranged with a number of crack planes running essentially vertical to the module plane. Provision can also be made for bonding of the intermediate pane to the outer pane.

The invention also proposes that between the solar energy conversion device and the carrier panel there is arranged an ornamental pane provided with a number of crack planes running essentially vertical to the module plane.

A further embodiment of the solar-module in accordance with the invention is characterized by the fact that the ornamental pane is bonded to the bottom pane or carrier panel.

Furthermore, the invention proposes that the crack planes of at least one of the pane elements of the module are produced by mechanical and/or thermal stressing, in particular, edge stressing, of a single pane safety glass pane forming the pane element.

Provision can be made for the crack planes of at least one of the pane elements of the module to be produced by controlled linear application of stress in accordance with a specifiable pattern on a glass or plastic pane forming the pane element in question.

The invention proposes that in the interspace between the outer pane and the carrier panel there should be located a plastic layer, such as a laminated film combination, cast resin layer or the like, in which the solar energy conversion device, preferably an array of solar cells with a number of solar cells connected by connecting leads and conductors is embedded. The solar cells may be polycrystalline solar cells.

Furthermore, an embodiment of the invention is characterized by the fact that the intermediate pane and/or the ornamental pane is/are bonded to the outer pane or the bottom pane by means of laminated film(s).

The invention also proposes that the intermediate pane and/or the ornamental pane is/are bonded to the outer pane or the bottom pane by means of a cast resin layer.

A further embodiment of the invention of the solar module in accordance with the invention is characterized by the fact that the bottom pane or carrier panel consists of colored glass.

Provision can be made for the outer pane and/or the bottom pane to incorporate a non-transparent printed color coating in the area of the connecting leads and/or conductors of the solar energy conversion device.

The process according to the invention is characterized by the fact that the outer pane and/or carrier panel and/or the intermediate pane bonded to the outer pane on the side facing the solar energy conversion device and/or an ornamental pane bonded to the carrier panel on the side facing the solar energy conversion device are provided with a number of crack planes running essentially vertical to the module plane.

In this case, provision can be made for the crack planes of at least one of the pane elements of the module to be produced by mechanical and/or thermal stressing, preferably edge stressing of a single pane safety glass pane forming the pane element in question.

It is also possible to proceed in the case of the process according to the invention such that the crack planes are produced at least partially after completion of the bonding process by mechanical and/or thermal edge stressing of the pane element in question, such as impact stressing by means of a center punch or laser irradiation.

Finally, the invention also teaches the use of the solar module according to the invention as curtain wall element.

The invention is based on the surprising principle that it is possible, irrespective of the favorable ornamental effect, to largely prevent reduction in output, or at least to significantly reduce it, by providing one of the pane elements (outer pane, intermediate pane) on the side of the solar energy conversion device facing the incidence of light, referred to hereinafter as an array of solar cells, with crack planes running essentially vertical to the module plane. For example, it is possible to arrange on the side of the array of solar cells facing the incidence of light, that is behind the outer pane, a single safety glass pane with crack planes running essentially vertical to the module plane, as is known from, for example, U.S. Pat. No. 2,887,806 and DE-OS 20 08 415. By virtue of the fact that the pane element in question, for example, the single safety glass pane, possesses an ornamental texture which causes the solar cell structure behind it to appear less distinct to the observer, it has been found possible to achieve both the desired ornamental effect and to largely prevent any reduction in output. This is based on the fact that due to the crack planes running essentially vertical to the module plane, a significantly reduced part of the incident light is absorbed in the pane element in question, for example, in the single safety glass pane than would be the case when, for example, using light scattering particles with reflective surfaces also running transversely to the direction of incidence of light.

The ornamental pane of toughened single pane safety glass which, in the case of a special embodiment of the invention, is also arranged between a carrier panel consisting of silicate glass and the plastic layer with the array of solar cells embedded in it, has, in the case of solar cells which are light-sensitive on only one side, an ornamental effect and imparts a pleasing appearance to the solar module from the rear as well. Furthermore, this ornamental layer acts in the case of solar cells which are light-sensitive on both sides in a similar way to the single safety glass pane between the outer pane and the array of solar cells.

While the invention has been particularly shown and described with reference to preferred embodiments thereof, it will be understood by those in the art that the foregoing and other changes in form and details may be made therein without departing from the spirit and scope of the invention.

We claim:

1. A solar module comprising an outer pane of clear, transparent glass for receiving solar radiation, a carrier pane of at least partially transparent glass disposed in parallel spaced relation to the outer pane, a solar energy conversion device located between the outer pane and the carrier pane, wherein at least one of said panes has a number of crack planes running essentially perpendicular to said panes.

2. A solar module as set forth in claim 1, wherein said at least one of said panes is said outer pane.

3. A solar module as set forth in claim 1, wherein said at least one of said panes is said carrier pane.

4. A solar module as set forth in claim 1, wherein an intermediate glass pane is disposed between the outer pane and the solar energy conversion device and is provided with a number of crack panes running essentially perpendicular to said panes.

5. A solar module as set forth in claim 4, wherein the intermediate pane is bonded to the outer pane.

6. A solar module as set forth in claim 5, wherein the intermediate pane is bonded to the outer pane by means of a laminated film.

7. A solar module as set forth in claim 5, wherein the intermediate pane is bonded to the outer pane by a cast resin layer.

8. A solar module as set forth in claim 1, wherein an ornamental glass pane is disposed between the solar energy conversion device and the carrier pane and is provided with a number of crack planes running essentially perpendicular to said panes.

9. A solar module as set forth in claim 8, wherein the ornamental pane is bonded to the carrier pane.

10. A solar module as set forth in claim 9, wherein the ornamental pane is bonded to the carrier pane by means of a laminated film.

11. A solar module as set forth in claim 9, wherein the ornamental pane is bonded to the carrier pane by a cast resin layer.

12. A solar module as set forth in claim 1, wherein the solar energy device is comprised of an array of polycrystalline solar cells connected by connecting leads and conductors.

13. A solar module as set forth in claim 12, wherein at least one of the outer pane and the carrier pane is provided with a non-transparent printed color coating in the area of the connecting leads and conductors of the solar energy conversion device.

14. A solar module as set forth in claim 1, wherein the carrier pane is comprised of colored glass.

15. A solar module as set forth in claim 1, wherein the carrier pane is provided with a matte surface.

16. A process for the manufacture of a solar module comprising interposing a solar energy conversion device including an array of solar cells imbedded in a plastic layer between an outer pane and a carrier pane, bonding the outer pane and the carrier panel to the plastic layer and producing a plurality of crack planes in one of said planes.

17. A process as set forth in claim 16, wherein the crack planes of at least one of said panes are produced by mechanical edge stress of a single safety glass pane forming said at least one of said pane elements.

18. A process as set forth in claim 16, wherein the crack planes of said at least one of said panes are produced by thermal edge stress of said one of said panes wherein said one of said panes is comprised of safety glass.

* * * * *